(12) United States Patent
Guan et al.

(10) Patent No.: US 11,640,923 B2
(45) Date of Patent: May 2, 2023

(54) METHOD FOR MANUFACTURING FDSOI

(71) Applicant: SHANGHAI HUALI INTEGRATED CIRCUIT CORPORATION, Shanghai (CN)

(72) Inventors: Tianpeng Guan, Shanghai (CN); Jianghua Leng, Shanghai (CN); Zhonghua Li, Shanghai (CN); Yufeng Chen, Shanghai (CN); Nan Li, Shanghai (CN); Ming Tian, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/485,189

(22) Filed: Sep. 24, 2021

(65) Prior Publication Data

US 2022/0310443 A1    Sep. 29, 2022

(30) Foreign Application Priority Data

Mar. 29, 2021   (CN) .......................... 202110330231.9

(51) Int. Cl.
*H01L 21/762*    (2006.01)
(52) U.S. Cl.
CPC .............. *H01L 21/76243* (2013.01)
(58) Field of Classification Search
CPC ......... H01L 21/76243; H01L 21/76248; H01L 21/76294; H01L 21/79297; H01L 21/7624–76291; H01L 27/1203–1211; H01L 21/76264–76291

See application file for complete search history.

(56) References Cited

U.S. PATENT DOCUMENTS

2010/0327397 A1* 12/2010 Nakai ............... H01L 21/76243
                                                                    438/480
2017/0170178 A1*  6/2017 Cheng .................. H01L 27/092

* cited by examiner

*Primary Examiner* — Julio J Maldonado
*Assistant Examiner* — Stanetta D Isaac
(74) *Attorney, Agent, or Firm* — Alston & Bird LLP

(57) ABSTRACT

The present application provides a method for manufacturing FDSOI devices. The method includes steps of: providing a semiconductor structure which comprises a silicon substrate, a buried oxide layer on the silicon substrate, a silicon-on-insulator layer on the buried oxide layer; and a hard mask layer on the silicon-on-insulator layer; performing spin coating of a photoresist on the hard mask layer to form a bulk silicon region; performing plasma anisotropic etching on the bulk silicon region to open a part of the buried oxide layer, and then performing isotropic etching, so that the silicon-on-insulator layer shrinks in the horizontal direction; performing plasma anisotropic etching to etch through the buried oxide layer to form a bulk silicon region trench; performing silicon epitaxial growth in the bulk silicon region trench. The silicon-on-insulator layer is still shrinks after the bulk silicon region trench is formed, as the result, there is no bump on the surface of the silicon-on-insulator layer, thus the process window becomes controllable.

10 Claims, 3 Drawing Sheets

METHOD FOR MANUFACTURING FDSOI

CROSS-REFERENCES TO RELATED APPLICATIONS

This application claims the priority to Chinese patent application No. CN202110330231.9, filed on Mar. 29, 2021 at CNIPA, and entitled "METHOD FOR MANUFACTURING FDSOI", the disclosure of which is incorporated herein by reference in entirety.

TECHNICAL FIELD

The present application relates to the technical field of semiconductors, in particular to a method for manufacturing fully depleted silicon on insulator (FDSOI) devices.

BACKGROUND

During silicon epitaxial growth (Si-Epi) in a bulk silicon region of the existing FDSOI substrate for the 22 nm node, if a defect bump more than 200 Å high on the SOI surface may be formed after the silicon epitaxy growth is completed, this type of defects can render the surface of the silicon wafer uneven, which not only affects subsequent processes such as lithography and plasma etching, but also leads to pattern mis-connection thus reducing the FDSOI process window.

Therefore, it is necessary to provide a method to solve the above-mentioned problem in order to manufacture FDSOI.

BRIEF SUMMARY

In view of the above-mentioned defect of the existing art, the present application provides a method for manufacturing FDSOI, which has a reasonable process window, especially to broaden the process tolerance from a surface bump on top of the silicon epitaxy layer on the SOI substrate, in the process of manufacturing FDSOI.

The present application provides a method for manufacturing FDSOI, comprising at least the following steps:
- step 1. providing a semiconductor structure, wherein the semiconductor structure comprises: a silicon substrate; a buried oxide layer on the silicon substrate; a silicon-on-insulator layer on the buried oxide layer; and a hard mask layer on the silicon-on-insulator layer;
- step 2. performing spin coating with a photoresist on the hard mask layer, and performing lithography exposure and development to form a bulk silicon region;
- step 3. performing plasma anisotropic etching on the bulk silicon region to open a part of the buried oxide layer, and then performing isotropic etching, so that the silicon-on-insulator layer shrinks in the horizontal direction;
- step 4. performing plasma anisotropic etching to form a bulk silicon region trench through the buried oxide layer;
- step 5. removing the photoresist residue and etching residue; and
- step 6. performing silicon epitaxial growth in the bulk silicon region trench.

In some examples, the hard mask layer in step 1 is a silicon nitride layer or a composite layer comprising a silicon oxide layer and a silicon nitride layer, herein the silicon nitride layer is disposed on the silicon oxide layer.

In some examples, the thickness of the hard mask layer in step 1 is in a range of 100-500 Å.

In some examples, the thickness of the silicon-on-insulator layer in step 1 is in a range of 100-200 Å.

In some examples, the buried oxide layer in step 1 is a silicon dioxide layer, and the thickness thereof is in a range of 100-300 Å.

In some examples, the photoresist in step 2 comprises an anti-reflection layer.

In some examples, the silicon-on-insulator layer in step 3 shrinks by 50-100 Å in the horizontal direction.

In some examples, the bottom surface of the bulk silicon region trench is lower than the lower surface of the buried oxide layer by 20-100 Å in step 4.

In some examples, the method for removing the photoresist and the etching residue in step 5 comprises a wet removal method or a combination of wet removal and dry removal.

In some examples, the surface of the epitaxial silicon layer is flush with the upper surface of the silicon-on-insulator layer after the silicon epitaxial growth is performed in step 6.

The method for manufacturing FDSOI of the present application, as described above, has the following beneficial effects compared with the method of the existing techniques for manufacturing FDSOI: with the currently disclosed technique, the silicon-on-insulator layer is still shrinking after the bulk silicon region trench is formed, therefore there is no bump on the surface of the silicon-on-insulator layer, which controls the process window to be more accommodating.

DETAILED DESCRIPTION OF THE DISCLOSURE

The implementation of the present application is described below with specific examples, and those skilled in the art can easily understand other advantages and effects of the present application from the content disclosed in the description. The present application can also be implemented or applied in other different specific embodiments, and various details in the description can also be modified or changed on the basis of different viewpoints and applications without departing from the spirit of the present application.

Please refer to FIG. 1 to FIG. 6. It should be noted that the drawings provided in the embodiments only schematically illustrate the basic concept of the present application. The drawings only show the components related to the present application but are not drawn according to the number, shape, and size of the components in actual implementation. The type, quantity, and proportion of each component can be changed at random during actual implementation, and the component layout type may be more complicated.

Figure 6:
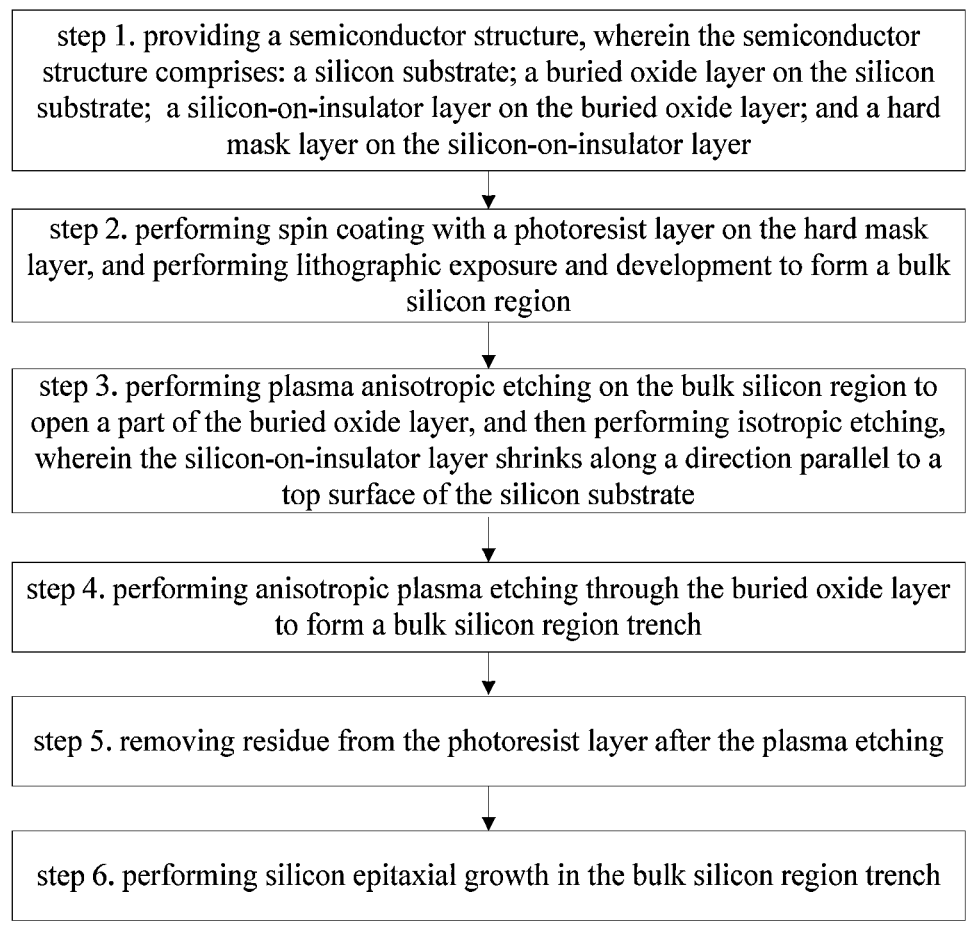
FIG. 6 is a flowchart of the method for manufacturing FDSOI according to the present application.

The present application provides a method for manufacturing a FDSOI device. FIG. 6 is a flowchart of the method for manufacturing FDSOI according to the present application. The method at least includes the following steps:

Step 1. Providing a semiconductor structure, wherein the semiconductor structure includes: a silicon substrate; a buried oxide layer on the silicon substrate; a silicon-on-insulator layer on the buried oxide layer; and a hard mask layer on the silicon-on-insulator layer.

Specifically, the hard mask layer in step 1 of this embodiment of the present application is a silicon nitride layer or a composite layer composed of a silicon oxide layer and a silicon nitride layer, and the silicon nitride layer is located on the silicon oxide layer in the composite layer. In this embodiment, the hard mask layer is a silicon nitride layer; in other embodiments, the hard mask layer may be a composite layer including a silicon nitride layer, and the silicon nitride layer is located on the silicon oxide layer in the composite layer.

Specifically, the thickness of the hard mask layer in step 1 of this embodiment of the present application is in the range of 100-500 Å. That is, the thickness of the silicon nitride layer in this embodiment is 100-500 Å. In other embodiments, the thickness of the composite layer is 100-500 Å.

Specifically, the thickness of the silicon-on-insulator layer in step 1 of this embodiment of the present application is 100-200 Å.

Specifically, the buried oxide layer in step 1 of this embodiment of the present application is a silicon dioxide layer, and the thickness thereof is in a range of 100-300 Å.

Step 2. Spin coating with a photoresist is performed on the hard mask layer, and exposure and development are performed to form a bulk silicon region. Specifically, the photoresist in step 2 of this embodiment of the present application includes an anti-reflection layer.

Figure 1:
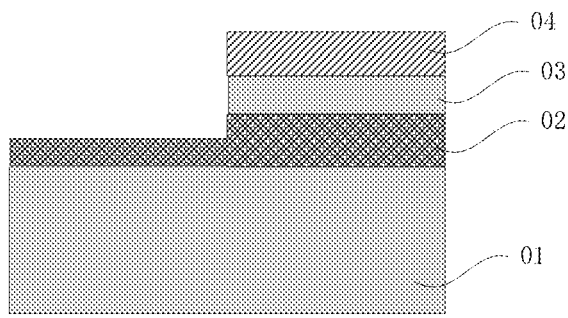
FIG. 1 is a schematic diagram of the semiconductor structure after etching to open a part of a buried oxide layer, according to the present application.
Figure 2:
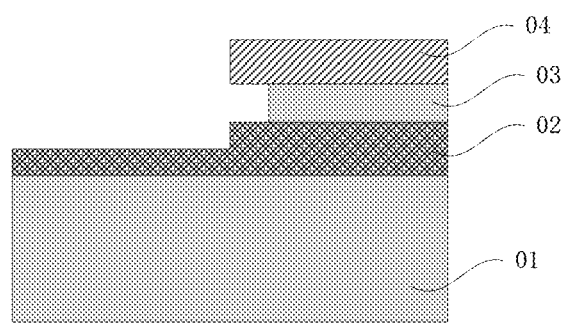
FIG. 2 is a schematic diagram of the shrank structure of silicon-on-insulator layer after isotropic etching according to the present application.

Step 3. Plasma anisotropic etching is performed on the bulk silicon region to open a part of the buried oxide layer, and then isotropic etching is performed, so that the silicon-on-insulator layer shrinks in the horizontal direction. Referring to FIG. 1, FIG. 1 is a schematic diagram of the semiconductor structure after etching to open a part of a buried oxide layer, according to the present application. The semiconductor structure includes: the silicon substrate 01; the buried oxide layer 02 on the silicon substrate 01; the silicon-on-insulator layer 03 on the buried oxide layer 02; and the hard mask layer 04 on the silicon-on-insulator layer 03. In step 3, the plasma anisotropic etching is performed on the bulk silicon region to open the buried oxide layer 02 and remain a part of the buried oxide layer, to form a groove. Then, the isotropic etching is performed to form a structure as shown in FIG. 2. FIG. 2 is a structural schematic diagram of the silicon-on-insulator layer shrinking after the isotropic etching according to the present application. The silicon-on-insulator layer 03 shrinks in the horizontal direction after the isotropic etching.

Specifically, the silicon-on-insulator layer in step 3 of this embodiment of the present application shrinks by 50-100 Å in the horizontal direction.

Figure 3:
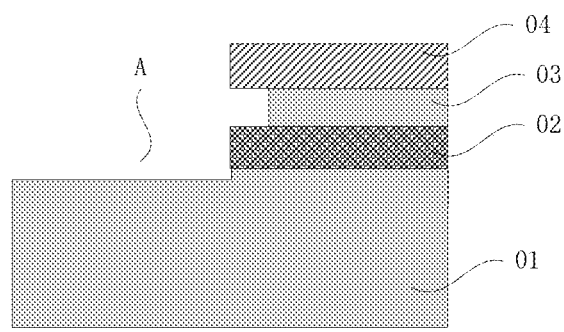
FIG. 3 is a schematic diagram of the structure after forming a bulk silicon region trench by means of etching according to the present application.

Step 4. Plasma anisotropic etching is performed to etch through the buried oxide layer to form a bulk silicon region trench. Referring to FIG. 3, FIG. 3 is a schematic diagram of the structure after forming the bulk silicon region trench by means of etching according to the present application. In step 4, the plasma anisotropic etching is performed to form the bulk silicon region trench A.

Specifically, the surface of the bulk silicon region trench is lower than the bottom surface of the buried oxide layer by 20-100 Å in step 4 of this embodiment of the present application.

Step 5. The photoresist and an etching residue are removed. Specifically, the method for removing the photoresist and the etching residue in step 5 of this embodiment of the present application includes a wet removal method or a combination of wet removal and dry removal. In this embodiment, the method for removing the photoresist and the etching residue is a wet removal method; in other embodiments, the photoresist and the etching residue may be removed by using a combined method of wet removal and dry removal.

Figure 4:
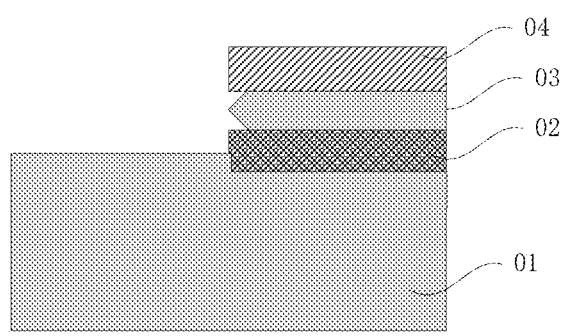
FIG. 4 is a schematic diagram of the structure after the silicon epitaxial layer is formed in the bulk silicon region according to the present application.
Figure 5:
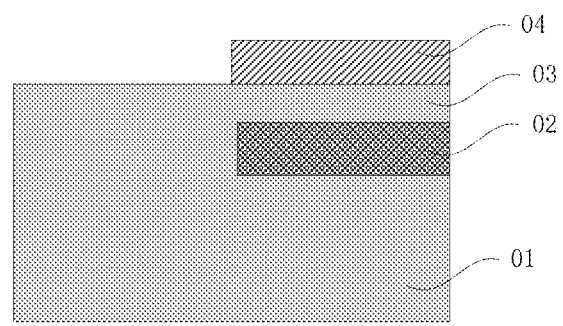
FIG. 5 is a schematic diagram showing the epi-silicon surface being flush with the upper surface of the silicon-on-insulator layer after the silicon epitaxial growth according to the present application.

Step 6. Silicon epitaxial growth is performed in the bulk silicon region trench. Referring to FIG. 4, FIG. 4 is a structural schematic diagram of performing the silicon epitaxial growth in the bulk silicon region trench to form the silicon epitaxial layer according to the present application. The formed silicon epitaxial layer and the substrate 01 form an integral body in FIG. 4. The silicon top surface is lower than the silicon-on-insulator layer after the silicon epitaxial growth in FIG. 4.

Specifically, the epi-silicon surface is flush with the upper surface of the silicon-on-insulator layer after the silicon epitaxial growth is performed in step 6 of this embodiment of the present application.

To sum up, the present application can realize a silicon epitaxial layer with no bump and controlled hard mask missing in an FDSOI process, thereby reducing process defects, expanding the FDSOI process window, and improving the device performance and product yield. Therefore, the present application effectively overcomes various defects in the prior art and thus has a high industrial value.

The above embodiments only exemplarily illustrate the principle and effects of the present application, bus are not intended to limit the present application. Any perform familiar with this technology can modify or change the above embodiments without departing from the spirit and scope of the present application. Therefore, any equivalent modification or change made by those with ordinary knowledge in the technical field without departing from the spirit and technical concept disclosed by the present application shall still be covered by the claims of the present application.

What is claimed is:

1. A method for manufacturing FDSOI (fully-depleted-silicon-on-insulator), at least comprising following steps:
   step 1. providing a semiconductor structure, wherein the semiconductor structure comprises: a silicon substrate; a buried oxide layer on the silicon substrate; a silicon-on-insulator layer on the buried oxide layer; and a hard mask layer on the silicon-on-insulator layer;
   step 2. performing spin coating with a photoresist layer on the hard mask layer, and performing lithographic exposure and development to form a bulk silicon region in the silicon substrate;
   step 3. performing plasma anisotropic etching into the bulk silicon region, wherein the buried oxide layer is etched partially to form a groove; and then performing isotropic etching, wherein the silicon-on-insulator layer shrinks away from the groove during the isotropic etching along a direction parallel to a top surface of the silicon substrate;

step 4. performing anisotropic plasma etching in the groove of the partially etched buried oxide layer to form a bulk silicon region trench lower than the top surface of the silicon substrate;

step 5. removing residue from the photoresist layer after the anisotropic plasma etching; and step 6. performing silicon epitaxial growth in the bulk silicon region trench.

2. The method for manufacturing FDSOI according to claim 1, wherein the hard mask layer in step 1 is a silicon nitride layer or a composite layer including a silicon oxide layer and a silicon nitride layer, wherein the silicon nitride layer is disposed on the silicon oxide layer.

3. The method for manufacturing FDSOI according to claim 2, wherein a thickness of the hard mask layer in step 1 is in a range of 100 Å-500 Å.

4. The method for manufacturing FDSOI according to claim 1, wherein a thickness of the silicon-on-insulator layer in step 1 is in a range of 100 Å-200 Å.

5. The method for manufacturing FDSOI according to claim 1, wherein the buried oxide layer in step 1 is a silicon dioxide layer, having a thickness in a range of 100 Å-300 Å.

6. The method for manufacturing FDSOI according to claim 1, wherein the photoresist layer in step 2 comprises an anti-reflection layer.

7. The method for manufacturing FDSOI according to claim 1, wherein the silicon-on-insulator layer in step 3 shrinks in a range from 50 Å to 100 Å in a direction parallel to the top surface of the silicon substrate.

8. The method for manufacturing FDSOI according to claim 1, wherein a bottom surface of the bulk silicon region trench is lower than a bottom surface of the buried oxide layer by a range of 20 Å-100 Å in step 4.

9. The method for manufacturing FDSOI according to claim 1, wherein the method for removing the residue of the photoresist layer after the plasma etching in step 5 comprises a wet removal method or a combination of wet removal and dry removal.

10. The method for manufacturing FDSOI according to claim 1, wherein a surface of the epitaxial silicon layer is flush with an upper surface of the silicon-on-insulator layer after the silicon epitaxial growth is performed in step 6.

* * * * *